United States Patent [19]

Gates

[11] Patent Number: 5,489,554
[45] Date of Patent: Feb. 6, 1996

[54] METHOD OF MAKING A 3-DIMENSIONAL CIRCUIT ASSEMBLY HAVING ELECTRICAL CONTACTS THAT EXTEND THROUGH THE IC LAYER

[75] Inventor: James L. Gates, Lake Oswego, Oreg.

[73] Assignee: Hughes Aircraft Company, Los Angeles, Calif.

[21] Appl. No.: 192,207

[22] Filed: Feb. 4, 1994

Related U.S. Application Data

[62] Division of Ser. No. 918,343, Jul. 21, 1992.

[51] Int. Cl.⁶ .................................................. H01L 21/18
[52] U.S. Cl. .................................................. 437/208; 437/915
[58] Field of Search .................................. 257/777, 774; 437/187, 974, 209, 208, 203, 86, 195; 148/DIG. 12, DIG. 135

[56] References Cited

U.S. PATENT DOCUMENTS

| | | | |
|---|---|---|---|
| 3,648,131 | 3/1972 | Stuby | 257/774 |
| 4,122,479 | 10/1978 | Sugawara et al. | 257/777 |
| 4,467,340 | 8/1984 | Rode et al. | 257/451 |
| 4,612,083 | 9/1986 | Yasumoto et al. | 437/208 |
| 4,829,018 | 5/1989 | Wahlstrom | 437/974 |
| 5,122,856 | 6/1992 | Komiya | 257/774 |
| 5,191,405 | 3/1993 | Tomita et al. | 257/777 |
| 5,227,013 | 7/1994 | Kumar | 156/644 |
| 5,229,647 | 7/1993 | Gnadinger | 257/774 |
| 5,236,871 | 8/1993 | Fossum et al. | 437/203 |
| 5,270,261 | 12/1993 | Bertin et al. | 148/DIG. 135 |

FOREIGN PATENT DOCUMENTS

| | | |
|---|---|---|
| 61-125150 | 10/1986 | Japan. |
| 63-213943 | 9/1988 | Japan. |
| 63-300510 | 12/1988 | Japan. |
| 5055455 | 7/1993 | Japan. |

*Primary Examiner*—Olik Chaudhuri
*Assistant Examiner*—Brian K. Dutton
*Attorney, Agent, or Firm*—W. C. Schubert; W. K. Denson-Low

[57] ABSTRACT

A 3-dimensional circuit assembly includes a lower substrate, a first integrated circuit (IC) layer that is adhered to and electrically insulated from the substrate, electrical contacts for the IC layer, and separate electrical contacts for the substrate that extend through and are insulated from the IC layer. The IC layer is surmounted by an insulating layer through which the electrical contacts also extend, and across which interconnections between different contacts may be made. The IC layer and substrate are held together by an adhesion layer, with the adhesion, IC and insulating layers all being thin enough to assume the coefficient of thermal expansion for the underlying substrate, which is much thicker. The substrate may itself have a second IC layer to which contacts are made, or it may be implemented as the photodetector of a focal plane array. Two standard wafers are used to form the package, with the substrate for the upper wafer removed either before or after bonding to the lower wafer. Additional IC layers may be added by adding additional wafers in a similar fashion.

11 Claims, 4 Drawing Sheets

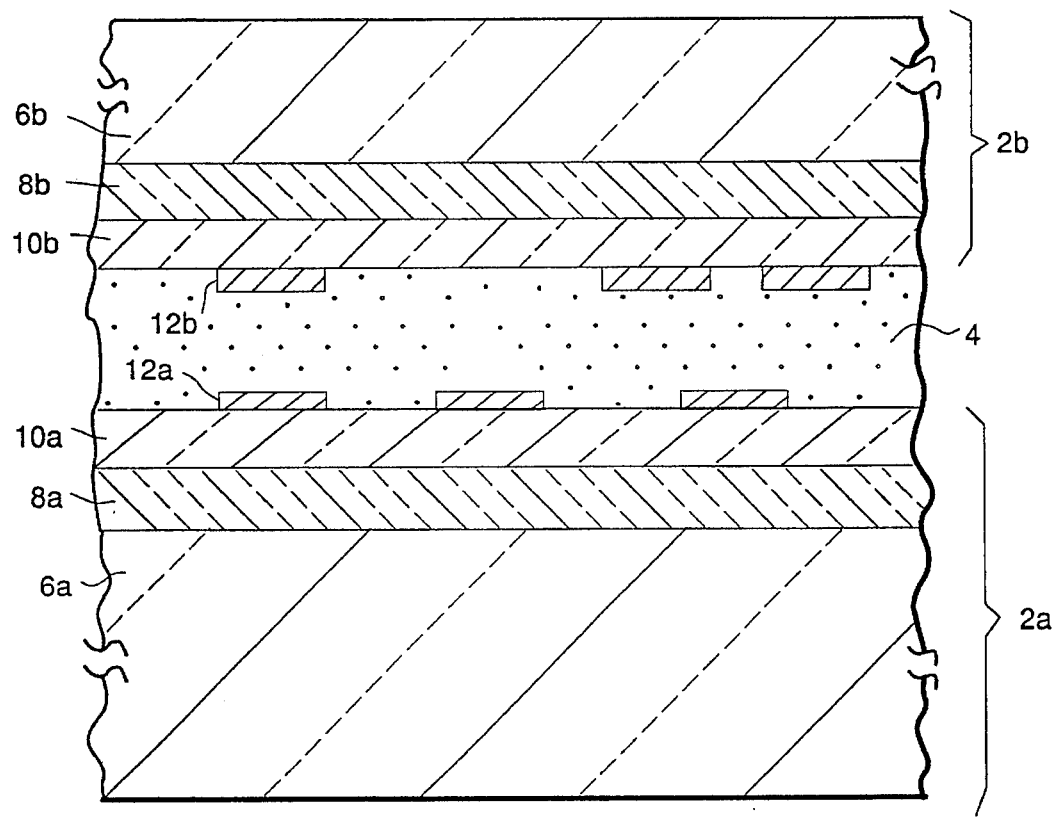
FIG. 1a.
FIG. 1b.
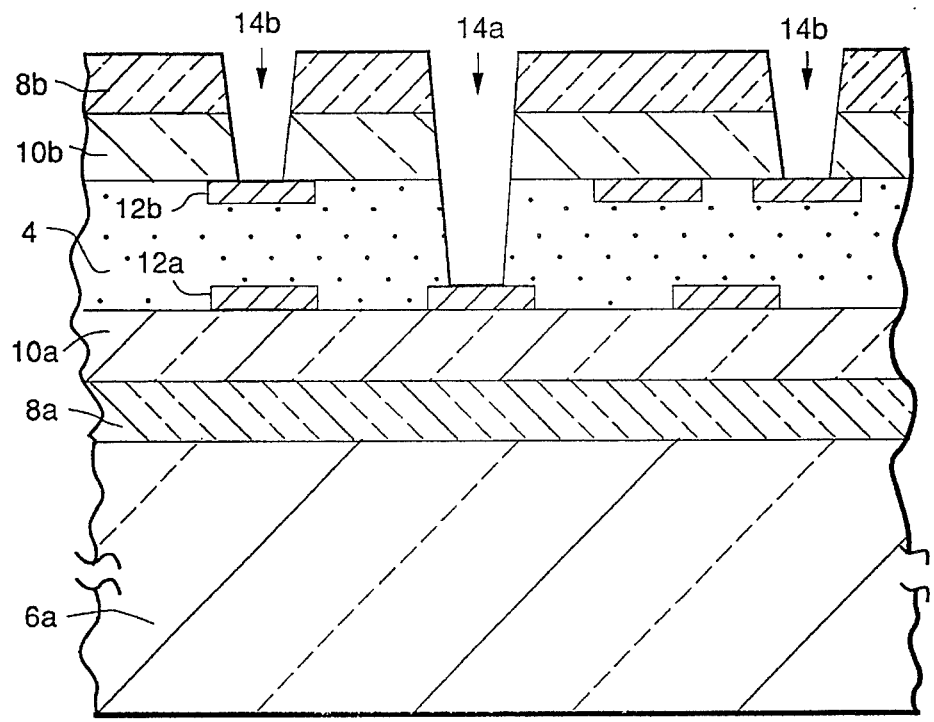

METHOD OF MAKING A 3-DIMENSIONAL CIRCUIT ASSEMBLY HAVING ELECTRICAL CONTACTS THAT EXTEND THROUGH THE IC LAYER

This is a divisional of application Ser. No. 07/918,343 filed Jul. 21, 1992 now abandoned.

BACKGROUND OF THE INVENTION

1. Field of the Invention

This invention relates to high density circuit packages, and more particularly to three-dimensional circuit assemblies and fabrication techniques for packaging either multiple integrated circuit layers as a unitary assembly, or a focal plane array together with associated readout circuitry.

2. Description of the Related Art

In an attempt to increase the density of integrated circuit (IC) packages, efforts have been made to incorporate multiple circuit layers within the same package, with various mechanisms for interconnecting the different layers and providing externally accessible input/output ports. In a similar vein, effort has also been directed towards integrating the fabrication of a focal plane array with its readout circuitry.

One of the challenges in successfully implementing a 3-D circuit package has been to bring connections for the interior circuit layers out to the exterior of the package so they can be readily addressed by the user. One method to accomplish this has been developed by Hughes Aircraft Company, the assignee of the present invention, and is referred to as the thermal gradient zone melt technique. This approach is described in M. J. Little et al., "The 3-D Computer", *Proc. of IEEE Int'l. Conf. on Wafer Scale Integration*, Jan. 3, 1989, pages 55–64. It involves the distribution of aluminum dots on the surface of a silicon wafer within which circuit layers have been fabricated. A device is heated to about 1,100°–1,200° C., causing the aluminum dots to melt and dissolve into the underlying silicon. This produces a conductive feedthrough composed of an aluminum/silicon alloy extending into the wafer from the location of each dot, and having a much lower resistivity than the surrounding silicon. The feedthroughs extend down to the circuit layer and thereby provide an external electrical access. While successfully producing feedthroughs to the circuit layers, this technique is subject to density limitations in the zone melts, and can result in a feedthrough capacitance that is excessive for certain applications.

In the area of focal plane arrays, a "loop hole" or "VIMIS" (vertically integrated metal-insulator-semiconductor) technique has been developed in which a chip of photodetector material is glued to readout circuitry. The photodetector is then thinned, and openings are etched through it to access contact pads for an integrated circuit on the other side of the chip. The openings are then metallized to provide electrical connections through the detector to the readout circuitry. This technique is described, for example, in Amingual, "Advanced Infrared Multiple Plane Arrays", *SPIE Infrared and Optoelectronic Materials and Devices*, Vol. 1512, 1991, pages 40–51. However, it is limited to n on p detectors and has a fill factor limitation, meaning that the etched openings through the photodetector reduce the amount of material left to perform the photodetection function. Since the detector substrate must be relatively thick, the etched openings expand to undesirably large dimensions towards the surface of the photodetector.

Another focal plane array assembly uses indium "bumps" to mechanically secure a detector chip to a cell processing chip, and to provide a matrix of electrical contacts therebetween. This technique is described in U.S. Pat. No. 4,740,700, assigned to Hughes Aircraft Company, and is also referred to in the Amingual reference mentioned above. Although the bumps establish interconnects between two interior layers of the overall device, they do not provide access to the readout circuitry from an exterior surface of the device.

SUMMARY OF THE INVENTION

The present invention seeks to provide a 3-D circuit assembly that does not suffer from the limitations described above in connection with the prior devices, that allows for a higher circuitry density and if desired a mix of process technologies or materials, that is readily expandable to add additional circuit layers as desired, and that does not use up photodetector area for other purposes when used for a focal plane array.

In the accomplishment of these goals two completed wafers are bonded together, one of which has an IC layer on its surface and the other of which either has a second IC layer or is a photodetector substrate. The first wafer preferably consists of, in sequence, a substrate, a thin insulative layer, and the first IC layer. When the two wafers have been bonded together, preferably either by an insulative adhesive or insulative thermal fusion layers, the upper substrate is removed to expose the upper insulative layer. A first set of openings is then formed through the upper insulative layer to the first IC layer, and a second set of openings is formed through the insulative, first IC and adhering layers to the lower substrate. These openings are filled with a conductive material to establish externally accessible electrical connections with the upper IC layer and lower substrate, with the connections interconnected as desired by extending them over the surface of the upper insulative layer. The upper IC layer and lower substrate layer may be provided with respective contact pads, with the electrical connections routed to respective pads.

The lower substrate may include a second IC layer with which electrical contact is established. Alternately, when the lower substrate serves as a photodetector, it is provided with pixel contact pads with which the electrical connections are made through the openings in the overlying layers. The openings are preferably lined with an insulative material to avoid shorting out the upper IC layer.

Although the bonding material used to secure the two parts of the assembly together will normally have a coefficient of thermal expansion that substantially differs from that of the lower substrate, it is made thin enough so that it substantially assumes the substrate's thermal movements. The upper IC and insulative layers likewise assume the thicker substrate's thermal movements. Additional IC layers can be fabricated over the upper insulative layer, with each additional IC layer electrically insulated from the IC layer immediately below by a respective insulative layer. A set of electrical contacts for each additional IC layer is fabricated through the IC and insulative layers above the subject IC layer in a manner similar to the electrical contacts for the first IC layer and the lower substrate. Each of these additional layers are also preferably thin enough to substantially assume the lower substrate's thermal movements.

These and other features and advantages of the invention will be apparent to those skilled in the art from the following detailed description, taken together with the accompanying drawings, in which:

DESCRIPTION OF THE DRAWINGS

FIGS. 1a, 1b and 1c are sectional views, not to scale, showing three successive stages in the fabrication of a 3-D circuit assembly in accordance with the invention;

DETAILED DESCRIPTION OF THE INVENTION

Figure 1C:
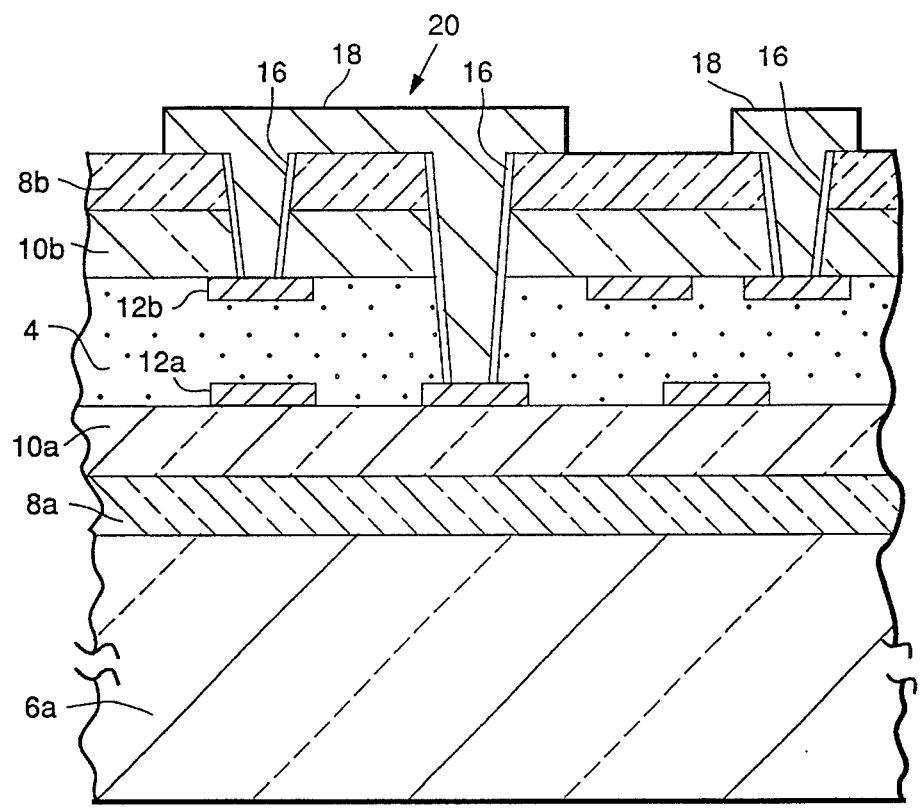

The present invention makes it possible to fabricate a 3-D circuit structure from two or more standard wafers, each of which has its own circuit layer. The first step in the preferred fabrication method is illustrated in FIG. 1a. Two conventional bonded silicon wafers 2a and 2b are shown, with the upper wafer 2b inverted and secured to the lower wafer 2a by a thin layer of electrically insulating adhesive 4 that is cured after the wafers are positioned. Accurate wafer alignment techniques are available that have been developed in connection with the known bump bonding technology mentioned above.

Each wafer includes a relatively thick silicon substrate 6a, 6b, a thin electrically insulative silicon dioxide layer 8a, 8b on the silicon substrate, and a thin silicon-based IC layer 10a, 10b on the respective $SiO_2$ layer 8a and 8b. The insulator layer 8a may be omitted unless it is desired as an insulator for IC layer 10a. It is generally desirable to include insulator layer 8b, even if there is not a need for upper insulation of IC layer 10b, since layer 8b serves as an etch stop during the subsequent removal of the upper substrate 6b, as described below. Lower substrate 6a would not normally be removed, so insulator layer 8a serves only an insulating and not an etch stop function.

Typical thicknesses for the elements of each bonded wafer are 525 microns for the silicon substrates 6a, 6b, 0.2–2 microns for the $SiO_2$ layers 8a, 8b, and 0.2–2 microns for the IC layers 10a, 10b. Details of the actual circuitry fabricated in the IC layers are not shown, but generally the circuitry itself would extend about 0.3 microns deep into the IC layers and can include devices such as transistors, capacitors, etc. Aluminum contact pads 12a, 12b are provided on the circuit faces of the two wafers 2a, 2b for making electrical contacts to their respective ICs through openings in a thin insulating film (not shown).

One of the advantages of the invention is that the circuitry on the two wafers may be formed with different process techniques, such as bipolar vs. CMOS (complementary metal-oxide-semiconductor); since the wafers are provided as standard items before being bonded together, they can be fabricated totally independent of each other. Furthermore, although silicon based circuits are illustrated, other materials such as GaAs could also be used; one material could be used for one wafer and other material for the other wafer so long as they are compatible with the interconnections provided between the two. There is also flexibility in the choice of material for the isolation layers 8a and 8b; aluminum nitride or silicon nitride might be substituted for silicon dioxide.

The silicon substrates 6a, 6b and silicon-based IC layers 10a, 10b will generally have similar coefficients of thermal expansion, but this coefficient will generally be different from the temperature coefficients for the isolation layers 8a, 8b and the adhesive 4. While this might ordinarily be expected to result in the possibility of cracking over the normal design temperature range of –55° C.–125° C., the adhesive layer 4 is kept to a few microns in thickness. The thin dimensions for both the adhesive and isolation layers cause them to effectively assume the thermal expansion coefficient of the much thicker silicon substrate 6a to which they are bonded, so that the thermal expansion and contraction of the adhesive and isolation layers is controlled by and generally matches the thermal expansion of the silicon substrate. This stretching of the thinner material layers inhibits either cracking or delamination when significant temperature differentials are encountered.

A suitable material for the adhesive layer 4 is produced by Ablestick, Inc. under the designation GA47-2LV. Instead of the adhesive layer 4, thin layers of a fusible bonding material such as high temperature glass could be used, with the wafers bonded together by heating the fusible material. In this event the thickness of the bonding layer would still preferably be restricted to a few microns.

In the next fabrication steps, the results of which are illustrated in FIG. 1b, the upper substrate 6b has been removed, preferably by etching it away while using the $SiO_2$ layer 8b as an etch stop. Alternately, the substrate 6b can be removed first and the remaining IC layer 10b and insulative layer 8b aligned to the underlying wafer 2a with the assistance of an intermediate carrier. Openings are then made through the assembly to access selected contact pads 12a, 12b, and thus expose a path to electrically contact the portions of the circuitry to which these pads are connected.

The contact pad 12b for the IC layer 10b are accessed with via openings 14b through the upper $SiO_2$ layer 8b and IC layer 10b, while the contact pads 12a for the lower IC layer 10a are accessed with via openings via 14a through the upper $SiO_2$ layer 8b, upper IC layer 10b and the adhesive layer 4. Presently available trenching techniques, such as disclosed in Copper, et al., "Physical and Electrical Characteristics of Submicron Trench Capacitors", *Extended Abstracts, The Electrochemical Society*, Vol. 90–2, Oct. 14–19, 1990, pages 410–411; and U.S. Pat. No. 4,702,795 to Douglas, permit these openings to be kept to a few microns in diameter or less. Since the relatively thick upper substrate 6b has been removed before the openings are made, the openings need extend only through the thin layers 8b, 10b and 4, and thus any spreading is minimized.

The via openings 14a and 14b can be formed by either chemical etching or reactive ion etching. Although trenching to the contact pads 12a and 12b is illustrated, the via openings 14a and 14b could also be established to desired metallization locations directly on the ICs themselves; the metallization of either the ICs or contact pads are preferably used as an etch stop. The via opening locations are controlled by a conventional mask technique, in which the upper $SiO_2$ layer 8b can function as the etch mask.

FIG. 1c shows a later stage in the device's fabrication. The sidewalls of the via openings have been coated with respective sleeves 16 of an insulative material such as glass ($SiO_2$). The sleeves 16 are applied by a process such as chemical vapor deposition, with the insulative coating removed from the bottoms of the via openings preferably by a photoetching process, either reactive ion etching or hydrofluoric acid. A metallization 18, preferably aluminum, is then deposited over the upper surface of the SiO₂ layer 8b and into the via openings, through which it forms electrically conductive members that establish electrical connections to their respective contact pads 12a and 12b. The sleeves 16 insulate the electrical contacts from the surrounding IC layer 10b.

The metallization layer on the upper surface of SiO₂ layer 8b is next photoetched to establish desired interconnections between the contact pads for the two IC layers 10a and 10b. Where desired, the metallization layer may be left intact so as to extend over the surface of SiO₂ layer 8b and interconnect a contact to one IC layer with a contact to the other; such an interconnection is indicated by numeral 20.

At this point the device may be considered to be essentially complete, and the wafer can be tested and diced using conventional techniques. The result is a set of high density 3-D circuit chips that have a sturdy construction, are useable over the full normal temperature range, and can have different circuit layers that employ different circuitry processes and even different materials.

Figure 2A:
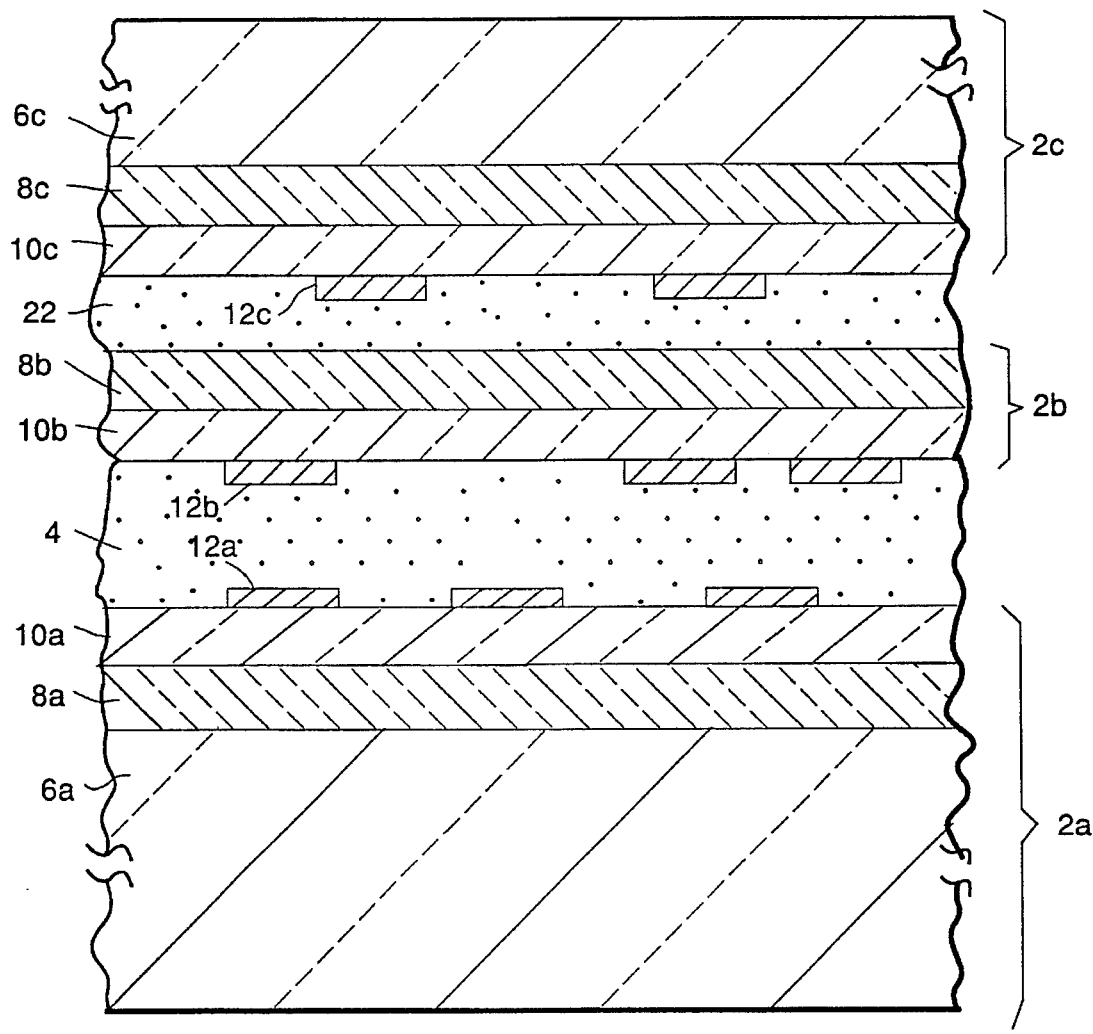
FIGS. 2a and 2b are sectional views, not to scale, illustrating successive steps in the fabrication of a circuit assembly with at least one additional circuit layer to those employed in FIGS. 1a–1b.
Figure 2B:
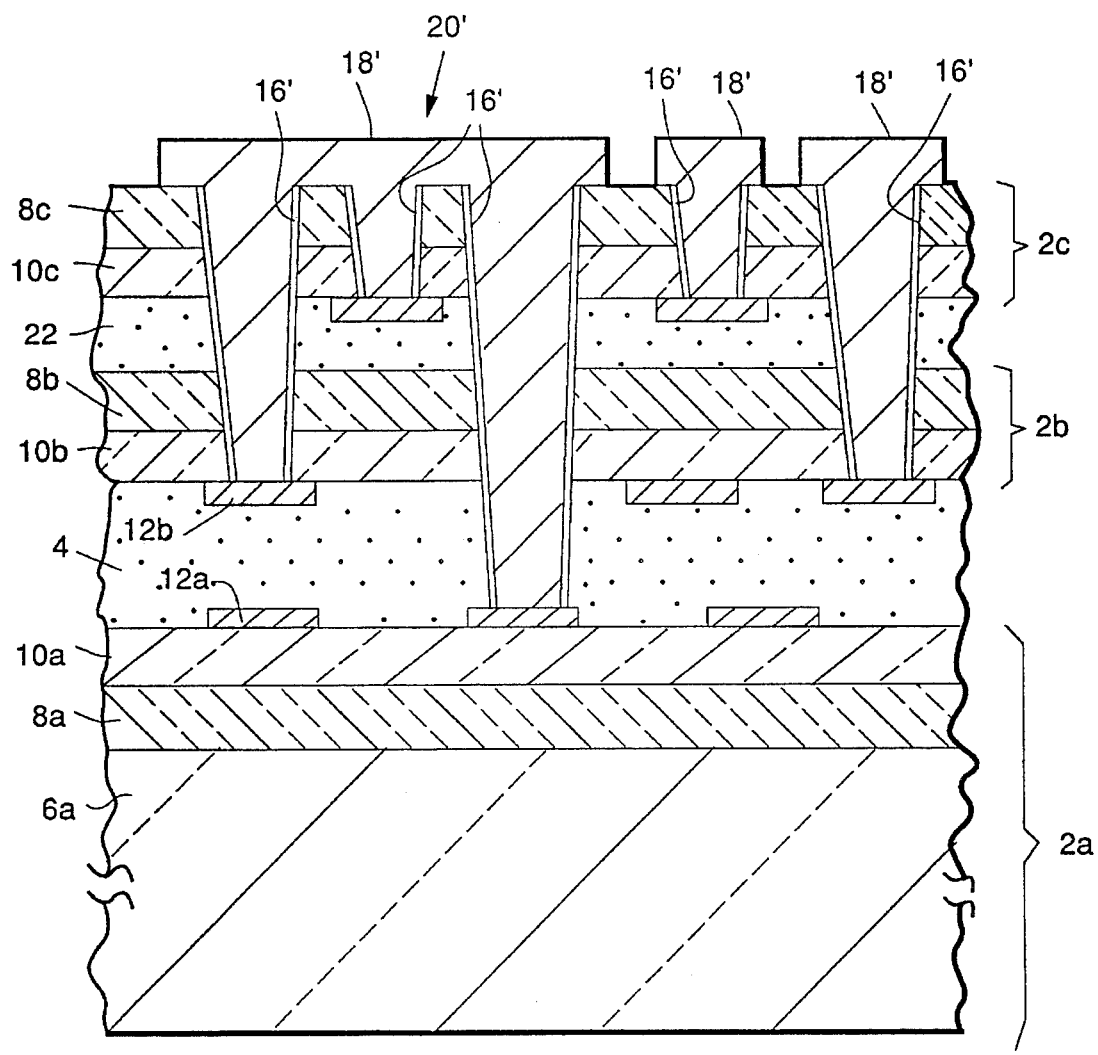

A variation of the 3-D circuit package and fabrication technique of FIGS. 1a–1c is illustrated in FIGS. 2a and 2b. In FIG. 2a a third conventional bonded wafer 2c has been inverted and adhered to the SiO₂ isolation layer 8b of the wafer 2b, after the removal of the upper substrate 6b (FIG. 1a) from wafer 2b. The new wafer 2c consists of a silicon (or other desired semiconductor) substrate 6c, an insulation layer 8c and an integrated circuit layer 10c with associated contact pads 12c. It is adhered to the underlying insulation layer 8b by a thin layer of adhesive or fusion bonded material 22 similar to the adherent material 4. The uppermost wafer's insulating layer 8c, IC layer 10c and adherent layer 22 are again thin enough so that they each expand and contract along with the much thicker bottom substrate 6a.

After the upper wafer 2c has been attached its substrate 6c is etched away. Alternately, the substrate 6c can be removed first and the remainder of the wafer aligned and adhered to the lower assembly with the assistance of an intermediate carrier. Openings are then etched to selected contact pads for the three different IC layers, as illustrated in FIG. 2b, in a manner similar to the formation of the access openings shown in FIG. 1c, and the openings are lined with insulating sleeves 16'. A metallization 18' is then applied to the upper surface of the top SiO₂ layer 8c and into the access openings, where it is insulated from the surrounding IC layers by the insulating sleeves. As with the embodiment of FIG. 1c, the metallization 18' is etched to leave desired metal interconnects 20' extending across the surface of upper SiO₂ layer 8c and thereby interconnect selected contact pads at different levels in the device, while removing the metallization from the areas where it is not needed.

Additional IC layers can be added in a similar fashion. However, the circuit density achievable with each additional layer will be progressively reduced somewhat, since the upper IC layers are traversed by both their own leads (if their contact pads are on their underside) and by the leads for all of the lower IC layers. Furthermore, since the provision of additional layers increases the total thickness of the material that must be etched to access the lower IC layers, the access openings for those layers will tend to spread somewhat as they approach the upper surface of the package, thus further reducing the area available for circuitry in the upper layers.

Figure 3:
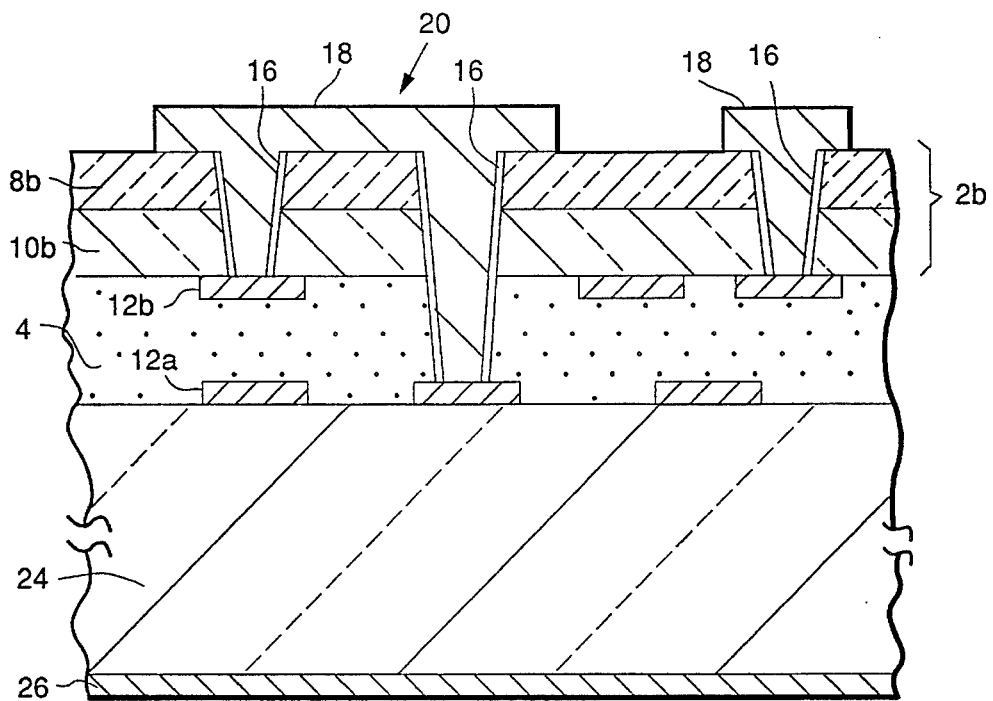
FIG. 3 is a sectional view, not to scale, of a focal plane array assembly that incorporates the invention.

Another application of the invention is for the detection of electromagnetic radiation, such as with an infrared focal plane array. As example of this application is shown in FIG. 3. Instead of the lower bonded wafer 2a of FIGS. 1a–1c and 2a–2b, a lower substrate 24 formed from a suitable photodetector material such as HgCdTe/CdTe is used to sense IR radiation that strikes the underside of the package. The photodetection can be accomplished either with a photoconductive material whose resistance is sensitive to radiation, or with a photovoltaic material whose voltage is sensitive to radiation. The radiation first passes through an anti-reflection coating sheet 26 on substrate 24, which is organized into a matrix of pixels, each pixel being provided with a respective pixel contact pad 12a on the upper surface of the substrate. With a photoconductive substrate, a voltage is supplied to electrode 26 and the voltage drop across the substrate 24 is determined for each pixel by the amount that pixel is illuminated by the radiation of interest. With a photovoltaic substrate, a contact (not shown) is made to the same surface of substrate 24 as the contacts 12a, and a voltage is dropped across photodiode depletion region of substrate 24.

The IC layer 10b and insulative layer 8b of the upper wafer 2b are adhered to the photodetector substrate 24 in a manner similar to the previously described embodiments. The readout circuitry for the focal plane array is provided in the IC layer 10b, and is interconnected with the various pixel contact pads 12a by metallized interconnections as in the previous embodiments. The result is a unitary focal plane array package that has a capacity for a high density readout circuitry layer integrated with the photodetector. If desired, additional layers of readout circuitry can be provided as illustrated in FIGS. 2a and 2b.

While different embodiments of a high density circuit assembly and an associated fabrication method have thus been shown and described, numerous variations and alternate embodiments will occur to those skilled in the art. Accordingly, it is intended that the invention limited only in terms of the appended claims.

I claim:

1. A method of fabricating a three-dimensional (3-D) circuit assembly, comprising:

providing a first substrate with a first set of at least one electrical contact pad thereon, adhering a first IC layer to said first substrate and electrically insulating said first IC layer and said first substrate from each other with an adherent material, said first IC layer provided with a layer of insulative material on its opposite side from said adherent material, establishing a first set of at least one electrical contact to said first IC layer, forming a first set of at least one opening through said layer of insulative material, said first IC layer and said adherent material to said first set of at least one electrical contact pad on said first substrate forming a second set of at least one opening through said layer of insulative material and through said first IC layer, said first set of at least one electrical contact extending through said second set of at least one opening, establishing a second set of at least one electrical contact through said first set of openings to said first set of at least one electrical contact pad on said first substrate.

2. The method of claim 1, wherein said layer of insulative material is initially provided on a second substrate and said second substrate is removed from said layer of insulative material prior to forming said first and second sets of at least one opening.

3. The method of claim 1, wherein said second substrate is removed by etching and said layer of insulative material is used as an etch stop.

4. The method of claim 1, wherein at least some of said first and second sets of at least one electrical contact are extended over said layer of insulative material whereby at least some of said first set of at least one electrical contact is in electrical contact with at least some of said second set of at least one electrical contact.

5. The method of claim 1, further comprising the step of lining said first and second sets of at least one opening with an electrically insulative material before said first and second sets of at least one electrical contact are extended through their respective openings.

6. The method of claim 1, further comprising the steps of forming one additional IC layer over said layer of insulative material, extending said first and second sets of at least one opening and at least one electrical contact through said additional IC layer, forming an additional respective set of at least one opening to said additional IC layer through said insulative layer, and establishing an additional respective set of at least one electrical contact through said additional set of openings to said additional IC layer.

7. The method of claim 1, wherein said adherent material comprises an adhesive and said first IC layer and said first substrate are adhered together by sandwiching said adhesive between them and curing the adhesive.

8. The method of claim 1, wherein said adherent material comprises a layer of thermally fusible material on each of said first IC layer and said first substrate, and said first IC layer and said first substrate are adhered together by sandwiching said layers of thermally fusible material between said first IC layer and said first substrate and thermally fusing said layers of thermally fusible material together.

9. The method of claim 1, wherein said adherent material is a layer whose thermal movements are controlled by said first substrate.

10. The method of claim 1, wherein a second IC layer is provided in said first substrate facing said first IC layer, and said second set of at least one electrical contact is established with said second IC layer.

11. The method of claim 1, wherein said first substrate comprises a photodetector and is provided with an array of pixel contact pads facing said first IC layer, and said second set of at least one electrical contact is established by forming discrete electrically conductive members through said first set of at least one opening to establish electrical contact with respective pixel contact pads.

* * * * *